(12) United States Patent
Takanashi

(10) Patent No.: US 10,607,835 B2
(45) Date of Patent: Mar. 31, 2020

(54) ETCHING METHOD

(71) Applicant: Tokyo Electron Limited, Tokyo (JP)

(72) Inventor: Yuki Takanashi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 11 days.

(21) Appl. No.: 15/769,828

(22) PCT Filed: Nov. 15, 2016

(86) PCT No.: PCT/JP2016/083812
§ 371 (c)(1),
(2) Date: Apr. 20, 2018

(87) PCT Pub. No.: WO2017/090484
PCT Pub. Date: Jun. 1, 2017

(65) Prior Publication Data
US 2019/0304774 A1    Oct. 3, 2019

(30) Foreign Application Priority Data
Nov. 26, 2015  (JP) .................................. 2015-230588

(51) Int. Cl.
*H01L 21/027* (2006.01)
*H01L 21/02* (2006.01)
(Continued)

(52) U.S. Cl.
CPC .... *H01L 21/0271* (2013.01); *H01L 21/02118* (2013.01); *H01L 21/02304* (2013.01);
(Continued)

(58) Field of Classification Search
CPC ......... H01L 21/31138; H01L 21/76816; H01L 21/31144; H01L 21/0337; H01L 21/4763; G03F 7/40
(Continued)

(56) References Cited

U.S. PATENT DOCUMENTS

2012/0244709 A1* 9/2012 Igarashi ............ H01J 37/32082
438/700
2015/0048049 A1* 2/2015 Nishimura ............. B82Y 30/00
216/37

FOREIGN PATENT DOCUMENTS

JP    2007-208255    8/2007
JP    2010-269304    12/2010
(Continued)

*Primary Examiner* — Binh X Tran
(74) *Attorney, Agent, or Firm* — IPUSA, PLLC

(57) ABSTRACT

An etching method is provided for etching a silicon-containing layer into a pattern of a mask that is formed by etching—from a block copolymer layer that includes a first polymer and a second polymer, that is layered on the silicon-containing layer of a process-target object via an intermediate layer, and that is enabled to be self-assembled—a region including the second polymer and the intermediate layer right under the region. The method includes forming a protective film on the mask by arranging upper and lower electrodes facing each other, by applying a negative DC voltage to the upper electrode in a processing chamber of a plasma processing apparatus in which the process-target object is provided, by applying high-frequency power to the upper or lower electrode, and by supplying a process gas including a hydrogen gas and an inert gas into the processing chamber to generate plasma.

8 Claims, 8 Drawing Sheets

(51) Int. Cl.
*H01L 21/311* (2006.01)
*H01L 21/3065* (2006.01)

(52) U.S. Cl.
CPC .... *H01L 21/3065* (2013.01); *H01L 21/31116* (2013.01); *H01L 21/31144* (2013.01)

(58) Field of Classification Search
USPC .............................. 438/717, 719, 725, 736
See application file for complete search history.

(56) References Cited

FOREIGN PATENT DOCUMENTS

| | | | |
|---|---|---|---|
| JP | 2012-204668 | 10/2012 | |
| JP | 2013-207089 | 10/2013 | |
| KR | 10-2012-0109343 | 10/2012 | |
| KR | 10-2014-0140020 | 12/2014 | |
| KR | 10-2015-0008098 | 1/2015 | |
| WO | WO-2013146538 A1 * | 10/2013 | ............. B82Y 30/00 |

* cited by examiner

FIG.6
FORMING PROTECTIVE FILM
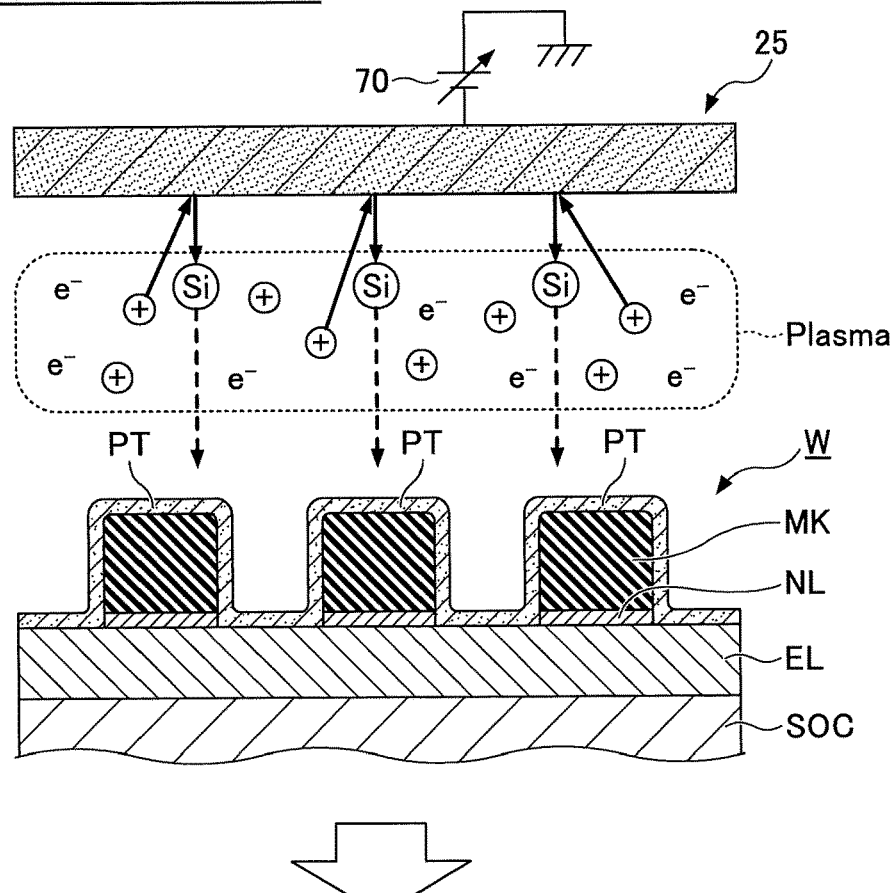
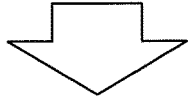
ETCHING ETCHING-TARGET LAYER
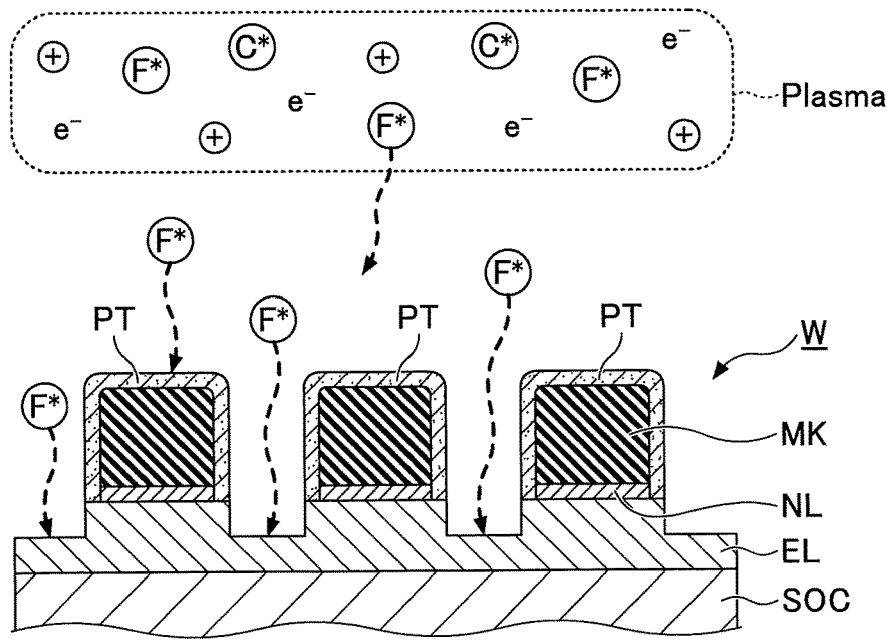

FIG.7

| | WITHOUT PREPROCESSING | WITH PREPROCESSING (WITHOUT APPLYING DC) | WITH PREPROCESSING (WITH APPLYING DC) |
|---|---|---|---|
| | MK(EL) | MK(EL) | MK(EL) |
| LWR | 2.6 nm | 2.6 nm | 2.3 nm |
| LER | 3.2 nm | 3.1 nm | 1.8 nm |

ETCHING METHOD

BACKGROUND OF THE INVENTION

1. Field of the Invention

The present invention relates to an etching method.

2. Description of the Related Art

In order to realize further miniaturization of devices such as semiconductor devices, it is necessary to form a pattern with dimensions less than the critical dimension obtained by micro-fabrication using conventional photolithography techniques. As one of the methods for forming a pattern with the above-described size, a next generation exposure technique, EUV (extreme ultra violet), is being developed. In EUV, a light beam with a wavelength less than the wavelength of the conventional UV light source is used. For example, the light beam with a very short wavelength, 13.5 nm, is used. Therefore, for example, EUV has a problem for mass production such as longer exposure time. Therefore, development of another production method is desired which is enabled to provide further miniaturized devices.

As a technique replacing the conventional lithography technique, a pattern forming technique has been proposed in which a self-assembled block copolymer (BCP) (one of the self-assembled materials that organize an ordered pattern spontaneously), is used for forming a pattern (e.g., refer to Patent Document 1 and Patent Document 2).

In the technique described in Patent Document 1, a block copolymer layer is applied onto the foundation layer. The block copolymer layer includes a block copolymer having two or more immiscible polymeric block components A and B. Further, annealing is carried out to effectuate spontaneous phase separation between the polymeric block components A and B. According to the above, an ordered pattern is obtained which includes a first region including the polymeric block component A and a second region including the polymeric block component B.

Further, in Patent Document 2, as a method for forming vias, block copolymer (BCP) patterning is proposed. In the block copolymer patterning described in Patent Document 2, a pattern is obtained by removing the second region of the phase separated first region and the second region of the block copolymer layer.

CITATION LIST

Patent Document

[Patent Document 1] Japanese Unexamined Patent Application Publication No. 2007-208255

[Patent Document 2] Japanese Unexamined Patent Application Publication No. 2010-269304

SUMMARY OF THE INVENTION

Technical Problem

However, in the techniques described in Patent Document 1 and Patent Document 2, a mask obtained by patterning of the block copolymer has low plasma tolerance. As a result, there is a case in which a mask pattern is wiggled (kinks of a mask pattern occur) (referred to as "wiggling") when etching is applied to a foundation layer such as Si-ARC (silicon-containing anti-reflection film) and SiON (silicon oxynitride film), and in which the roughness of the etching pattern of the foundation layer (unevenness generated on the wall surface of the pattern) is worsened. For example, the roughness of the etching pattern of the foundation layer is indicated by a value of LER (Line Edge roughness) or LWR (Line Width roughness) of the pattern formed by the etching. In particular, the LER value becomes greater when the roughness of the etching pattern of the foundation layer is worsened.

With respect to the above, a roughness improving method can be considered in which an electron beam or a UV beam is emitted onto the mask, and in which the roughness of the etching pattern of the foundation layer is improved by the treatment of the mask using a supplied $H_2$ gas or an Ar gas. However, in the etching in which the mask is made of a pattern of a block copolymer whose components are different from the components of the conventional ArF mask, even if the mask treatment is performed under the same condition setting as the ArF mask, it is difficult to properly improve the roughness of the etching pattern of the foundation layer.

In view of one or more problems described above, an object of an aspect of the present invention is to improve the roughness of the etching pattern.

Solution to Problem

In order to solve the one or more problems described above, according to an aspect of the present invention, an etching method is provided. The etching method is a method for etching a silicon-containing layer into a pattern of a mask that is formed by etching, from a block copolymer layer that includes a first polymer and a second polymer, that is layered on the silicon-containing layer of an object to be processed via an intermediate layer, and that is enabled to be self-assembled, a region including the second polymer and the intermediate layer right under the region. The etching method includes forming a protective film on the mask by arranging an upper electrode and a lower electrode facing each other, by applying a negative DC voltage to the upper electrode in a processing chamber of a plasma processing apparatus in which the object to be processed is provided, by applying high-frequency power to the upper electrode or the lower electrode, and by supplying a process gas including a hydrogen gas and an inert gas to the inside of the processing chamber to generate plasma; and etching the silicon-containing layer after the forming of the protective film.

Advantageous Effects of Invention

According to an aspect of the present invention, it is possible to improve the roughness of the etching pattern.

BRIEF DESCRIPTION OF THE DRAWINGS

FIG. 6 is a drawing illustrating an action onto the protective film and the etching according to an embodiment of the present invention.

FIG. 7 is a drawing illustrating results of performing an etching method according to an embodiment of the present invention.

DETAILED DESCRIPTION OF THE PREFERRED EMBODIMENTS

Figure 1:
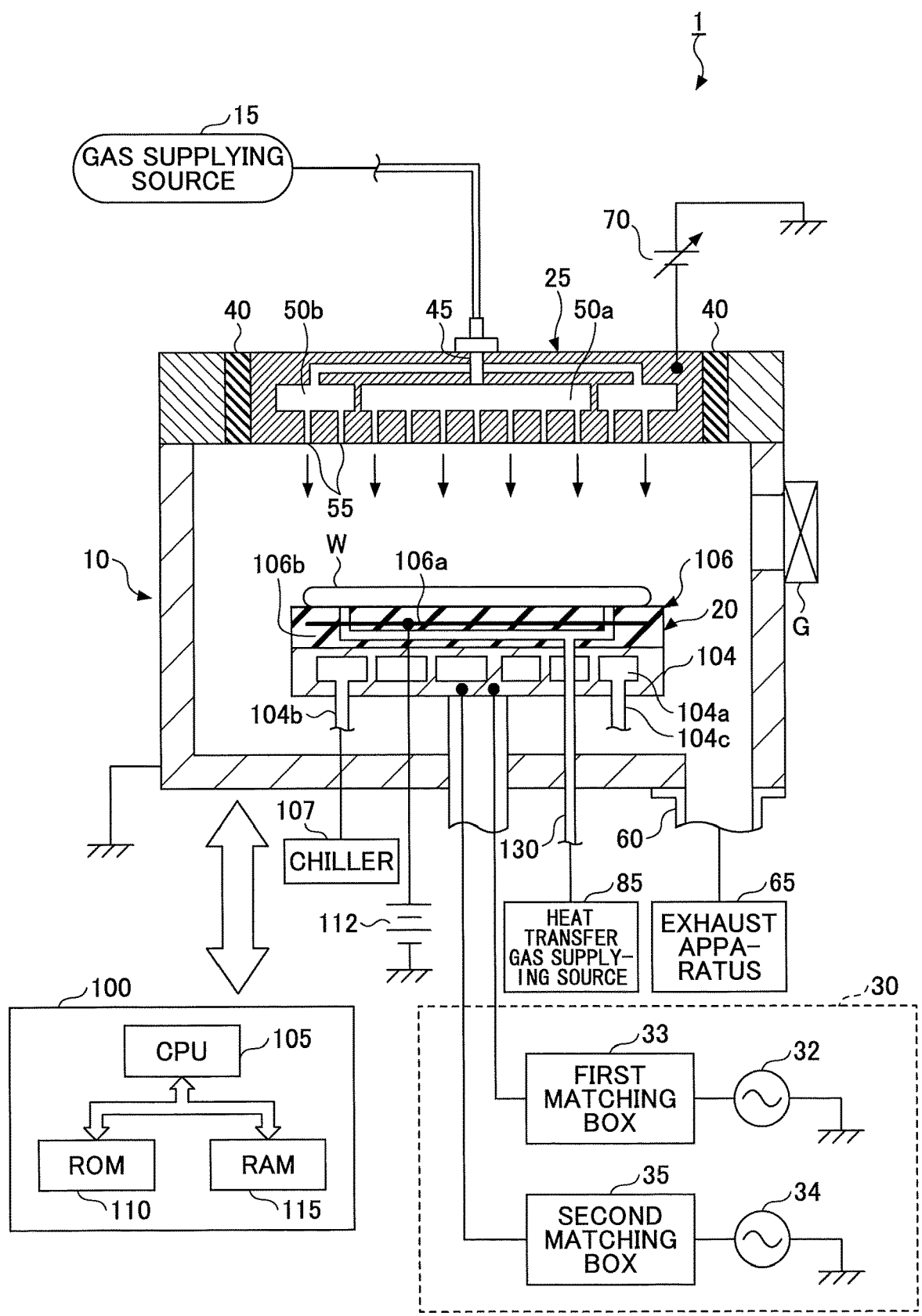
FIG. 1 is a schematic drawing illustrating an example of a plasma processing apparatus according to an embodiment of the present invention.

In the following, an embodiment of the present invention will be described while making reference to the drawings. It should be noted that, in the present specification and the drawings, the same reference numeral is given to substantially the same structure, and duplicated descriptions will be omitted.

[Plasma Processing Apparatus]

First, referring to FIG. 1, an example of a plasma processing apparatus 1 will be described. A plasma processing apparatus 1 according to an embodiment of the present invention is a capacitively-coupled parallel-plate-type plasma processing apparatus, and includes a processing chamber 10 having substantially a cylindrical shape. Alumite treatment (anodizing treatment) is applied to an inner surface of the processing chamber 10.

A susceptor 20 is provided in the bottom of the processing chamber 10, and a wafer W is placed on the susceptor 20. The wafer W is an example of an object to be processed (a process target object). The susceptor 20 is made of, for example, aluminum (Al), titanium (Ti), silicon carbide (SiC), etc. On an upper surface of the susceptor 20, an electro-static chuck 106 is provided to which the wafer W is electro-statically attracted. The electro-static chuck 106 has a structure in which a chuck electrode 106a is included in an insulator 106b. A DC voltage source 112 is connected to the chuck electrode 106a. The wafer W is attracted to the electro-static chuck 106 by Coulomb's force by applying a DC voltage HV to the chuck electrode 106a from the DC voltage source 112.

The susceptor 20 is supported by a support 104. A coolant flow path 104a is provided inside the support 104. The coolant flow path 104a is connected to a coolant entrance piping 104b and a coolant exit piping 104c. A cooling medium (hereinafter, referred to as "coolant"), such as cooling water or brine, output from a chiller 107 is circulated in the coolant entrance piping 104b, the coolant flow path 104a, and the coolant exit piping 104c. The heat of the susceptor 20 and the electro-static chuck 106 is removed by the coolant, and the susceptor 20 and the electro-static chuck 106 are cooled.

A heat-transfer gas supplying source 85 causes a heat-transfer gas such as a helium gas (He), an argon gas (Ar), etc., to pass through a gas supplying line 130, and supplies the heat-transfer gas to the rear surface of the wafer W on the electro-static chuck 106. With the above arrangement, the temperature of the electro-static chuck 106 is controlled by the coolant that is circulated through the coolant flow path 104a and by the heat-transfer gas supplied to the rear surface of the wafer W. As a result, it is possible to control the wafer to be at a predetermined temperature.

A power supplying apparatus 30 that supplies a two-frequency superimposed power is connected to the susceptor 20. The power supplying apparatus 30 includes a first high-frequency power source 32 that supplies high-frequency power HF with first frequency used for plasma generation, and a second high-frequency power source 34 that supplies high-frequency power LF with second frequency that is lower than the first frequency used for bias voltage generation. The first high-frequency power source 32 is electrically connected to the susceptor 20 via a first matching box 33. The second high-frequency power source 34 is electrically connected to the susceptor 20 via a second matching box 35. The first high-frequency power source 32 applies, for example, 60 MHz high-frequency power HF to the susceptor 20. The second high-frequency power source 34 applies, for example, 13.56 MHz high-frequency power LF to the susceptor 20. It should be noted that, in an embodiment of the present invention, the first high-frequency power is applied to the susceptor 20. The first high-frequency power may be applied to a gas shower head 25.

An internal (or output) impedance of the first high-frequency power source 32 is matched to load impedance by the first matching box 33. An internal (or output) impedance of the second high-frequency power source 34 is matched to load impedance by the second matching box 35. The first matching box 33 functions in such a way that the internal impedance of the first high-frequency power source 32 appears to match the load impedance when plasma is being generated in the processing chamber 10. The second matching box 35 functions in such a way that the internal impedance of the second high-frequency power source 34 appears to match the load impedance when plasma is being generated in the processing chamber 10.

The gas shower head 25 is provided to close an opening of the ceiling of the processing chamber 10 via a shield ring 40 that coats the outer edge of the gas shower head 25. The gas shower head 25 is connected to a variable DC power source 70, and a negative DC (DC voltage) is output from the variable DC power source 70 to the gas shower head 25. The gas shower head 25 is made of silicon.

In the gas shower head 25, a gas inlet 45 for introducing a gas is formed. Inside the gas shower head 25, there are a diffusion room 50a in the center and a diffusion room 50b in the edge that are branched from the gas inlet 45. A gas output from the gas supplying source 15 is supplied to the diffusion rooms 50a and 50b via the gas inlet 45. The supplied gas is diffused by the diffusion rooms 50a and 50b. The diffused gas is introduced towards the susceptor 20 from a number of gas supplying holes 55.

There is an exhaust port 60 in the bottom of the processing chamber 10. The gas in the processing chamber 10 is exhausted by an exhaust apparatus 65 that is connected to the exhaust port 60. With the above arrangement, it is possible to maintain the inside of the processing chamber 10 at a predetermined vacuum level. A gate valve G is provided on a side wall of the processing chamber 10. The gate valve G is used for opening and closing a loading/unloading opening when a wafer W is carried in and out of the processing chamber 10.

In the plasma processing apparatus 1, there is a control unit 100 used for controlling the entire operation of the apparatus. The control unit 100 includes a CPU (Central Processing Unit) 105, a ROM (Read Only Memory) 110, and a RAM (Random Access Memory) 115. The CPU 105 performs desired plasma processing, such as etching processing, according to various recipes stored in the storage areas described above. Apparatus control information, corresponding to process conditions such as etching conditions, is set in the recipes. The apparatus control information includes a process time, a process pressure (exhaust gas), high-frequency power and a voltage, various gas flow rates, temperatures in the processing chamber (upper electrode temperature, temperature of the side wall of the processing chamber, wafer W temperature, electro-static chuck temperature, etc.), the temperature of a coolant output from the chiller 107. It should be noted that the above-described recipes that indicate program conditions and processing conditions may be stored in a hard disk or a semiconductor memory. Further, the recipes may be stored in a portable computer-readable recording medium, such as a CD-ROM, DVD, etc., and may be read from the medium that is set at a predetermined position.

In preprocessing and in etching processing, the gate valve G is controlled to open and close, the wafer W is carried into the processing chamber 10, and the wafer W is placed on the susceptor 20. The wafer W is attracted to and retained by the electro-static chuck 106 by Coulomb's force by applying a DC voltage HV to the chuck electrode 106a from the DC voltage source 112.

Next, a process gas and high-frequency power used for the preprocessing are supplied to the inside of the processing chamber 10, and plasma is generated. The hardening is applied to the mask MK according to the generated plasma. Next, a process gas and high-frequency power used for the etching are supplied to the inside of the processing chamber 10, and plasma is generated. The plasma etching is applied to the wafer W according to the generated plasma. After the etching, static electricity of charges of the wafer W is eliminated by applying a DC voltage HV, whose electrical polarity is opposite to what has been applied when attracting the wafer W, to the chuck electrode 106a from the DC voltage source 112. According to the above operations, the wafer W is removed from the electro-static chuck 106, and the wafer W is carried out of the processing chamber 10 according to opening and closing of the gate valve G.

[Etching Method]

Figure 2:
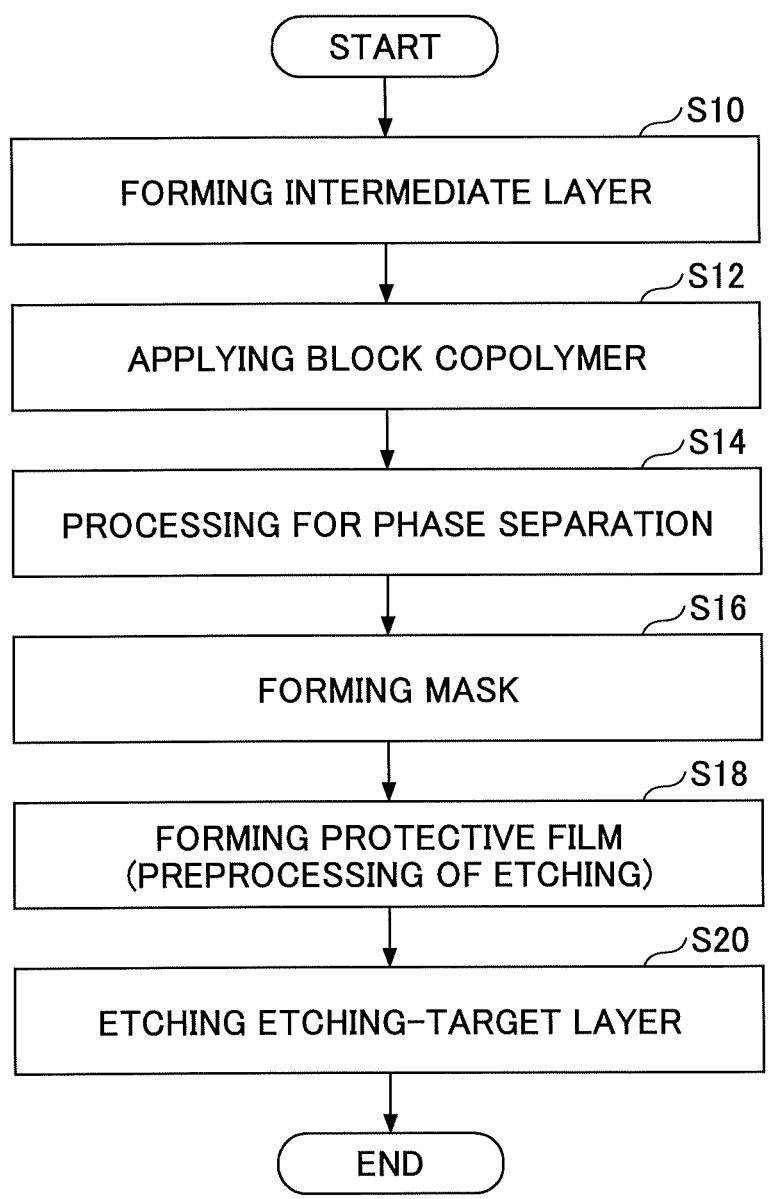
FIG. 2 is a flowchart illustrating an example of an etching method according to an embodiment of the present invention.
Figure 3:
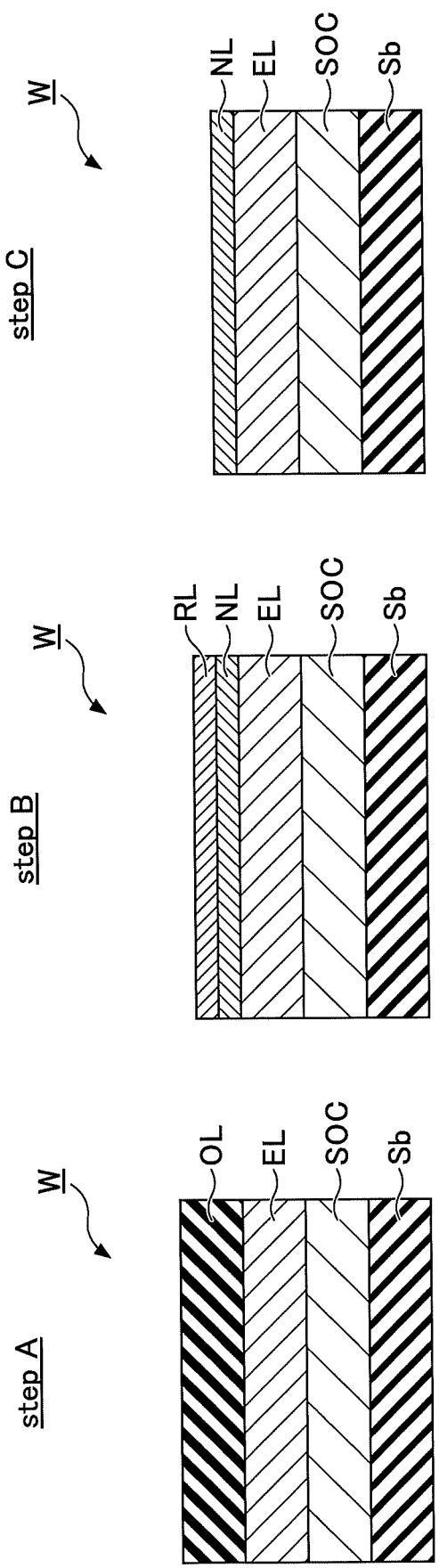
FIG. 3 is a drawing illustrating a cross section of a product produced at each step illustrated in FIG. 2.
Figure 4:
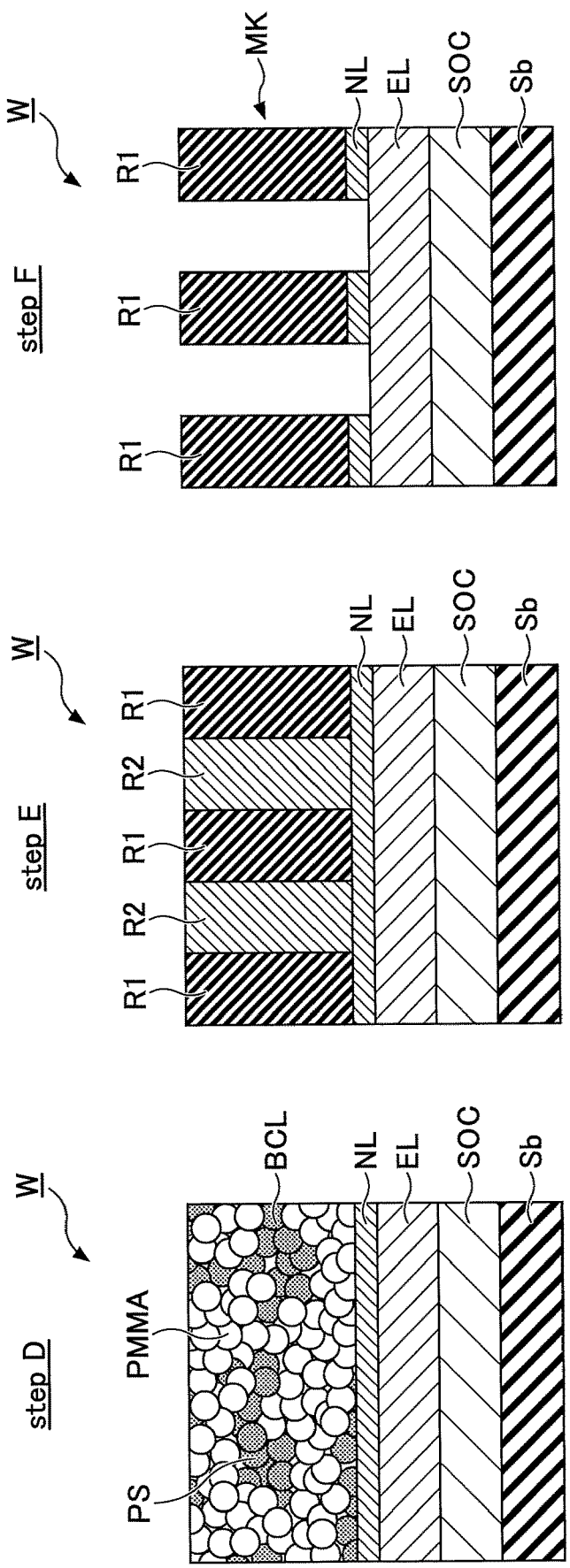
FIG. 4 is a drawing illustrating a cross section of a product produced at each step illustrated in FIG. 2.
Figure 5:
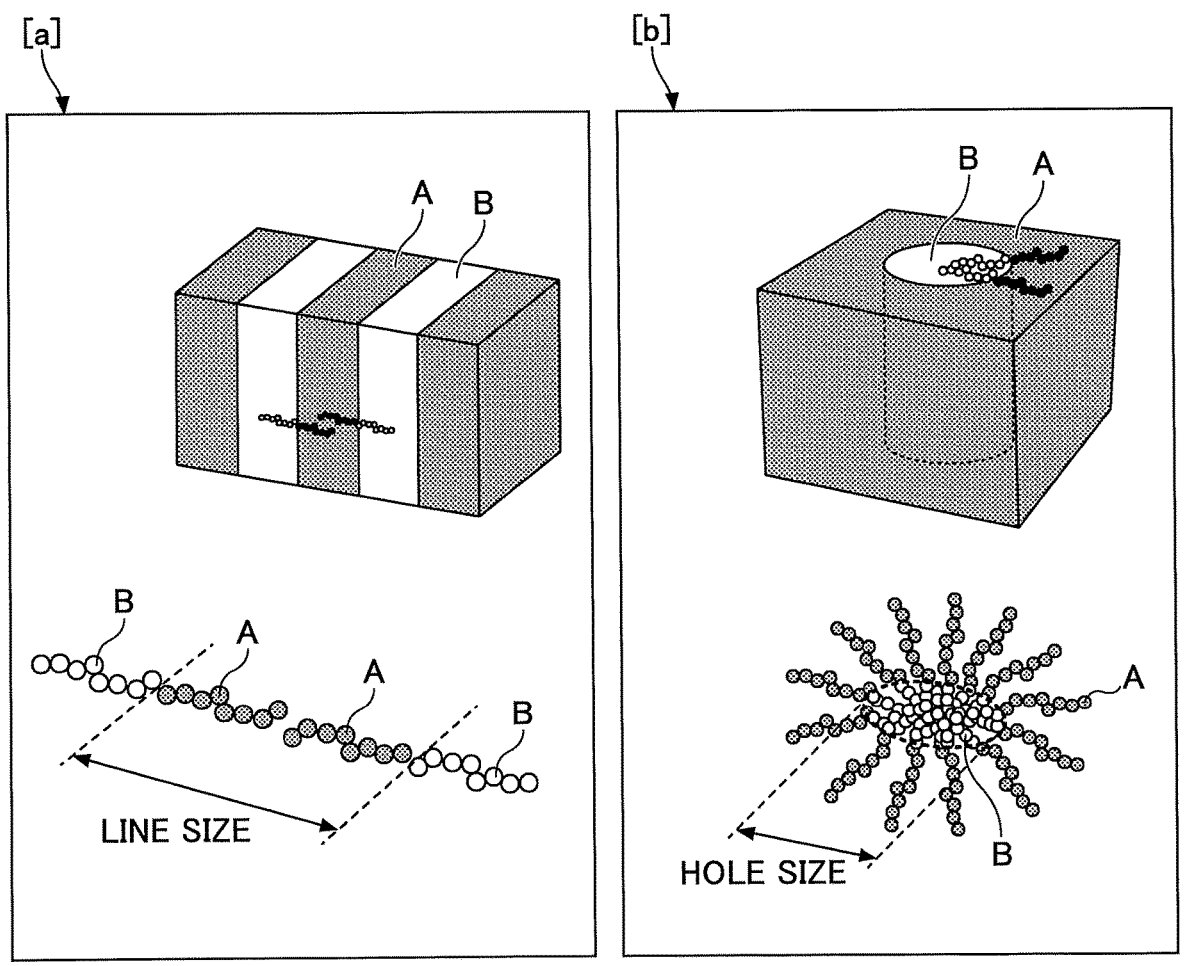
FIG. 5 is a drawing illustrating a self-assembly of a block copolymer.

FIG. 2 is a flowchart illustrating an etching method according to an embodiment of the present invention. FIG. 3, FIG. 4, and FIG. 5 are drawings illustrating cross sections, etc., of a product produced at each step illustrated in FIG. 2. As illustrated in FIG. 2, in an etching method according to an embodiment of the present invention, first, in step S10, an intermediate layer NL is formed on a surface of a wafer W that is an example of an object to be processed (process object, process target).

As illustrated in step A in FIG. 3, the wafer W includes a substrate Sb, a spin-on-carbon layer (SOC), and an etching target layer EL. The substrate Sb includes, for example, silicon. The spin-on-carbon layer SOC is formed by spin coating by applying a carbon-containing material. The spin-on-carbon layer, SOC, and the etching target layer EL are formed on the substrate Sb in this order. The etching target layer EL is a layer that includes silicon. For example, the etching target layer EL may be a silicon-containing layer including a silicon-containing anti-reflection layer (Si-ARC), a silicon nitride (SiN) layer, a silicon oxide (SiO$_x$) layer, a silicon oxynitride film (SiON) layer, etc. The film thickness of the etching target layer EL may be 15 to 20 nm.

In step S10, as illustrated in step A in FIG. 3, an organic film OL is applied onto the etching target layer EL. The organic film OL is, for example, a block copolymer of polystyrene and polymethyl methacrylate. Next, after application of the organic film OL, thermal processing is applied to the wafer W. The appropriate temperature of the thermal processing depends on types of the organic films OL, and is typically about 200 to 300 degrees Celsius. For example, the temperature of the thermal processing is 250 degrees Celsius. As illustrated in step B in FIG. 3, according to the thermal processing, the organic film OL shrinks as a whole, and an intermediate layer NL and an altered layer RL are formed from the organic film OL. It should be noted that the altered layer RL is a layer in which the carbon in the organic film OL has been altered.

Next, as illustrated in step C in FIG. 3, the altered layer RL is chemically removed by development processing. With the above operations, only the intermediate layer NL is formed on the etching target layer EL. The surface of the intermediate layer NL has a neutral state between hydrophobicity and hydrophilicity. The polymer in the block copolymer has strong hydrophilicity when the polymer length is short, and has strong hydrophobicity when the polymer length is long. In this way, in the polymer, there are a type having strong hydrophilicity and a type having strong hydrophobicity. Therefore, it is possible to have desired shapes of phase separation from the polymer by forming the intermediate layer NL whose surface has a neutral state.

Referring back to FIG. 2, in an etching method according to an embodiment of the present invention, next, in step S12, a block copolymer is applied onto the surface of the wafer W, that is, onto the surface of the intermediate layer NL. The block copolymer may be applied by using various methods including, for example, a spin coating method. With the above operations, as illustrated in step D in FIG. 4, a block copolymer layer BCL is formed on the surface of the intermediate layer NL.

The block copolymer is a self-assembled (self-assembling) block copolymer including a first polymer and a second polymer. In an embodiment of the present invention, the block copolymer is polystyrene-block-polymethyl methacrylate (PS-b-PMMA). The PS-b-PMMA includes polystyrene (PS) as the first polymer and polymethyl methacrylate (PMMA) as the second polymer.

Here, referring to FIG. 5, the block copolymer and the "self-assembled (self-assembling)" will be described by taking the PS-b-PMMA as an example. The PS and the PMMA are polymers (macromolecules) whose molecule is 0.7 nm in diameter. After applying the block copolymer including the PS and the PMMA that are immiscible with each other onto the intermediate layer NL to form a block copolymer layer BCL, if thermal processing (annealing) is applied to the wafer W at the temperature equal to or greater than the normal temperature (25 degrees Celsius) and equal to or less than 300 degrees Celsius, then the phase separation is effectuated in the block copolymer layer BCL. Typically, the annealing is applied at the temperature range between 200 to 250 degrees Celsius. With respect to the above, if the thermal processing is applied at the temperature higher than 300 degrees Celsius, then the phase separation is not effectuated in the block copolymer layer BCL, and the PS and the PMMA are arranged at random. Further, after the phase separation, even if the temperature is returned to a normal temperature, the block copolymer layer BCL still maintains the phase separation state.

When each of the polymer lengths is short, interaction (repulsive force) is weak and the hydrophilicity is strong. On the other hand, when each of the polymer lengths is long, interaction (repulsive force) is strong and the hydrophobicity is strong. By using the polymer characteristics described above, for example, phase separation structures of the PS and the PMMA can be produced as illustrated in FIG. 5 [a] and in FIG. 5 [b]. FIG. 5 [a] illustrates an example of a phase separation structure when a polymer A and a polymer B have substantially the same polymer length. In an example, the polymer A is a PS and the polymer B is a PMMA. In a case illustrated in FIG. 5 [a], interactions of polymers are the same. Therefore, when the thermal processing at about 250 degrees Celsius is applied to the block copolymer layer BCL, the polymer A and the polymer B are self-assembled to form line-shaped phase separation. In other words, the polymer A forms line-shaped first regions and the polymer B forms line-shaped second regions between the first regions. By using the phase separation structure described above, for example, it is possible to form line-and-space (L/S) periodic patterns by removing the second regions including the polymer B. The periodic patterns described above can be used as patterns for manufacturing devices such as semiconductor devices.

Further, FIG. 5 [b] illustrates a case of a phase separation structure in which the polymer length of the polymer A is significantly different from the polymer length of the polymer B (the polymer length of the polymer A is longer than the polymer length of the polymer B). In the case illustrated in FIG. 5 [b], the interaction (repulsive force) of the polymer A is strong and the interaction (repulsive force) of the polymer B is weak. When the thermal processing at about 250 degrees Celsius is applied to the block copolymer layer BCL described above, due to the strong interaction and the weak interaction of the polymers, the polymer A is self-assembled on the outer side and the polymer B is self-assembled on the inner side. In other words, the polymer B is self-assembled in a cylindrical shape to form a second region, and the polymer A is self-assembled to surround the cylindrical region and form a first region. By using the phase separation structure including the first region and the second region, for example, it is possible to form a periodic pattern of holes. The periodic pattern described above can also be used as a pattern for manufacturing devices such as semiconductor devices.

FIG. 2 is referred to again. Next, in step S14, a process for the phase separation of the block copolymer layer BCL is performed. For example, the phase separation is effectuated in the block copolymer layer BCL by heating the wafer W at the temperature between 200 to 300 degrees Celsius. With the above operations, as illustrated in step E in FIG. 4, first regions R1 including the first polymer and second regions R2 including the second polymer are formed in the block copolymer layer BCL. As described above, the first regions R1 and the second regions R2 may be a line-and-space pattern in which the regions are alternately provided. Alternatively, the second region R2 may be a cylindrical region and the first region R1 may surround the cylindrical region R2.

Next, after step S14 is performed and before step S16 is performed, the wafer W is carried into the plasma processing apparatus 1 illustrated in FIG. 1.

In step S16, a mask is formed. In the plasma processing apparatus 1, etching processing is applied to the second region R2 of the block copolymer layer BCL and to the intermediate layer NL that is right under the second region R2.

When step S16 is performed in the plasma processing apparatus 1, specifically, a process gas is supplied into the processing chamber 10 from the gas supplying source 15, and the pressure in the processing chamber 10 is reduced to a set value by the exhaust apparatus 65. Further, high-frequency power HF for plasma generation is supplied to the susceptor 20 from the first high-frequency power source 32. It should be noted that, in step S16, if necessary, high-frequency power LF for bias voltage from the second high-frequency power source 34 may be supplied to the susceptor 20. The process gas used in step S16 is a gas for applying the etching to the second region R2 including the second polymer and to the intermediate layer NL right under the second region R2, and the process gas may include an O2 (oxygen) gas. Further, the process gas may further include a rare gas such as an Ar gas, or include an inert gas such as a $N_2$ (nitrogen) gas.

In step S16, the etching is applied to the block copolymer layer BCL made of organic material according to active species of oxygen, the etching starting from the surface of the BCL. Here, the etching rate of the second region R2 including the second polymer is higher than the etching rate of the first region R1 including the first polymer. Therefore, in step S16, the etching is selectively applied to the second region R2. Further, the etching is applied to a part of the intermediate layer NL that has been exposed by the removal of the second region R2. According to step S16, the wafer W will be in a state as illustrated in step F in FIG. 4. In other words, a mask MK including the first region R1 and including the intermediate layer NL right under the first region R1 is formed.

Next, as illustrated in FIG. 2, in step S18, as preprocessing of the etching processing performed in the following step S20, a protective film is formed on the mask MK. At this time, in step S18, in the plasma processing apparatus 1, plasma is generated under the process condition as shown below, and the wafer W is exposed to the plasma.

<Process Condition for Forming the Protective Film>
Pressure: 50 mT (6.6661 Pa)
Type of gas: a gas including H2 and Ar
Power (high-frequency power HF): 300 W
Temperature (susceptor): 10 degrees Celsius
DC: to be output When step S18 is performed in the plasma processing apparatus 1, a process gas that includes a hydrogen gas and an argon gas is supplied to the inside of the processing chamber 10 from the gas supplying source 15, and the pressure in the processing chamber 10 is reduced to a set value by the exhaust apparatus 65. Further, high-frequency power HF is supplied to the susceptor 20 from the first high-frequency power source 32. Further, in step S18, if necessary, high-frequency power LF may be supplied to the susceptor 20 from the second high-frequency power source 34.

As illustrated in "forming protective film" on the upper side of FIG. 6, in step S18, the plasma, that has been generated from the process gas that includes a hydrogen gas and an argon gas, includes an argon ion and a hydrogen ion that have a positive charge. Further, the upper electrode is made of silicon, and a DC (direct current) is applied to the upper electrode. According to the above operations, argon ions and hydrogen ions in the plasma are drawn to the upper electrode, and thus, sputtering is applied to the upper electrode. As a result, silicon is ejected from the upper electrode, and the ejected silicon is laminated (layered, deposited, accumulated) on the mask MK. According to the above operations, a protective film PT made of silicon (Si) is formed on the mask MK. Polystyrene (PS) included in the mask MK is in a state where treatment by hydrogen plasma, or the like, has been applied to the PS, and is coated by the protective film PT made of silicon.

Referring back to FIG. 2, next, in step S20, the etching target layer EL, that has been exposed to the opening of the mask MK, is etched. At this time, in step S20, in the plasma processing apparatus 1, plasma is generated under the process condition as shown below, and the wafer W is exposed to the plasma.

<Process Condition at the Time of Etching>
Pressure: 15 mT (1.9998 Pa)
Type of gas: a gas including CF4 and CHF3
Power (high-frequency power HF): 400 W
Power (high-frequency power LF): 60 W
Temperature (susceptor): 10 degrees Celsius
DC: not to be output In the case where step S20 is performed in the plasma processing apparatus 1 under the above condition, a process gas that includes a fluorocarbon gas is supplied to the inside of the processing chamber 10 from the gas supplying source 15, and the pressure in the processing chamber 10 is reduced to a set value by the exhaust apparatus 65. Further, high-frequency power HF is supplied to the susceptor 20 from the first high-frequency power source 32. Further, in step S20, high-frequency power LF is supplied to the susceptor 20 from the second high-frequency power source 34.

In this way, in step S20, in the plasma processing apparatus 1, plasma of a process gas that includes a fluorocarbon gas is generated, and the wafer W is exposed to the plasma. The plasma described above includes active species of fluorine. Therefore, according to step S20, the protective film PT on the etching target layer EL, which has been exposed to the opening of the mask MK, is etched, and the etching target layer right under the protective film PT is also etched. According to step S20 as described above, as illustrated in "etching of etching-target layer" on the lower side in FIG. 6, the etching target layer EL is etched into the pattern of the mask MK. It should be noted that the processing gas that is used in step S20 may include a hydrofluorocarbon gas such as a CHF3 gas in addition to or in place of a fluorocarbon gas such as a CF4 gas. Further, the processing gas may further include a rare gas such as an Ar gas.

It should be noted that the etching processing according to an embodiment of the present invention is ended after the etching of the silicon-containing anti-reflection layer (Si-ARC) as the etching target layer EL is performed in step S20 as illustrated in FIG. 2. After the etching process according to an embodiment of the present invention, the etching of the spin-on-carbon layer SOC is performed.

According to an etching method according to an embodiment of the present invention as described above, as pre-processing of the etching of the etching target layer EL, a process is performed in which the protective film PT is formed on the mask MK and the mask MK is hardened. According to the above operations, it is possible to protect the mask MK at the time of the etching of the etching target layer EL performed in step S20. In other words, by the hardening of the mask MK and the forming of the protective film PT, it is possible to prevent readily occurrence of kinks of the mask MK at the time of etching in step S20. Therefore, it is possible to prevent the roughness of the etching pattern of the etching target layer, or the like, from getting worse. According to the above arrangement, it is possible to prevent the kinks of the pattern, and it is possible to etch the etching target layer while maintaining the line width of the pattern. Further, according to the hardening of the mask MK and the forming of the protective film PT, it is possible to increase the selection ratio of the mask MK with respect to the etching target layer EL.

Further, according to an etching method according to an embodiment of the present invention, because the composition of the mask MK of the block copolymer layer that is enabled to self-assemble is different from the composition of the ArF mask or EUV mask, the appropriate process condition for the mask MK of the block copolymer layer is used. According to the above, it is possible to decrease the roughness of the etching pattern of the etching target layer EL, etc., while enabling the micro-fabrication using the mask MK of the block copolymer layer, and while maintaining the height of the mask MK and the line width of the pattern.

Effect Example

Figure 8:
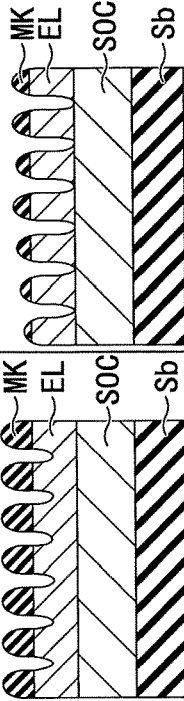
FIG. 8 is a drawing illustrating result examples when an etching method according to an embodiment of the present invention is performed and when an etching method according to a comparative example is performed.

Referring to FIG. 7 and FIG. 8, an example of a result of the etching of the etching target layer EL according to an etching method according to an embodiment of the present invention will be described. FIG. 7 is a drawing illustrating a result example when an etching method according to an embodiment of the present invention is performed. FIG. 8 is a drawing illustrating result examples when an etching method according to an embodiment of the present invention is performed and when an etching method according to a comparative example is performed.

A line-and-space pattern in the left most in FIG. 7 is a result example of a case of etching the etching target layer EL without performing the preprocessing. In this result, LWR is 2.6, LER is 3.2, and there is occurrence of kinks in the line-and-space pattern of the mask MK.

With respect to the above, line-and-space patterns in the center and the right most in FIG. 7 are result examples of cases of etching the etching target layer EL after performing the preprocessing. In other words, in the examples in the center and the right most in FIG. 7, treatment using hydrogen plasma, or the like, is performed as the preprocessing of the etching of the etching target layer EL. It should be noted that the center of FIG. 7 illustrates a result example of a case in which DC is not supplied to the upper electrode at the time of preprocessing. In this case, LWR is 2.6 and LER is 3.1. Further, the right most of FIG. 7 illustrates a result example of a case in which DC is supplied to the upper electrode at the time of preprocessing. In this case, LWR is 2.3 and LER is 1.8.

According to the results described above, the kinks of the line-and-space pattern of the mask MK are significantly reduced in the case where DC is supplied as compared with the case in which DC is not supplied. In other words, in the case where the etching target layer is etched without the preprocessing, the roughness of the etching pattern of the etching target layer EL, or the like, is the largest as illustrated in the left most in FIG. 7. In the case where the etching target layer EL is etched after the preprocessing in which the treatment using hydrogen plasma, or the like, is applied to the mask while supplying DC, the roughness of the etching pattern of the etching target layer, or the like, becomes smaller.

In particular, the LER value becomes greater when the roughness of the etching pattern of the foundation layer is worsened. With respect to the above, as illustrated in the right most in FIG. 7, in the case where the preprocessing is performed in which the treatment using hydrogen plasma, or the like, is applied to the mask while supplying DC, LER is improved by 1.0 or more as compared with the case in which the preprocessing is not performed.

Further, a result has been obtained that the roughness of the mask MK is not improved significantly in the case where the preprocessing is performed in which treatment using hydrogen plasma, or the like, is applied to the mask without supplying DC. According to the above, it should be understood that, by performing the preprocessing in which treatment using hydrogen plasma, or the like, is applied to the mask while supplying DC, the mask MK is coated by the protective film PT formed by the silicon deposit, and that it is possible to improve the roughness of the mask MK.

In FIG. 8, the upper half illustrates states of the mask MK and the target etching layer EL after each step in the case where the preprocessing is not performed, and the lower half illustrates states of the mask MK and the target etching layer EL after each step in the case where the preprocessing is performed while supplying DC at the time of preprocessing. It should be noted that the intermediate layer NL is omitted in FIG. 8. In each of the upper half and the lower half in FIG. 8, the upper side is a cross section view of the layered films including the mask MK and the etching target layer EL, and the lower side is a perspective view of the layered films.

In each of the upper half and the lower half in FIG. 8, an "initial state before the etching", a state after the "preprocessing" (there is no preprocessing in the upper half in FIG. 8, and there are preprocessing and supplying DC in the lower half in FIG. 8), a state after the "etching a part of the etching target layer EL", and a state after the "etching all of the etching target layer EL", of the mask MK and the etching target layer EL are illustrated in this order from the left to the right.

Referring to FIG. 8, in the case where the "etching a part of the etching target layer EL" or the "etching all of the etching target layer EL" is performed without preprocessing as illustrated in the upper half, there is occurrence of kinks of the pattern of the mask MK. In this way, according to the results of the "etching a part of the etching target layer EL" and the "etching all of the etching target layer EL", there is occurrence of kinks of the pattern of the mask MK during the etching, and thus, the roughness of the etching pattern of the etching target layer EL, or the like, is worsened.

With respect to the above, according to the results of the "etching a part of the etching target layer EL" and the "etching all of the etching target layer EL" in the case where the preprocessing is performed and DC is supplied at the time of preprocessing as illustrated in the lower half in FIG. 8, there is no occurrence of kinks of the pattern of the mask MK during the etching, and thus, it is understood that the roughness of the etching pattern of the etching target layer EL, or the like, is improved.

As described above, by supplying DC at the time of preprocessing in which the treatment according to hydrogen plasma, or the like, is applied to the mask MK, and by coating the protective film PT on the mask MK without causing the etching target layer EL including silicon to be etched, it is possible to increase the resist tolerance when etching the etching target layer EL using fluorine-based gas plasma, and it is possible to appropriately secure the remaining film amount of the mask MK. According to the above, it is possible to improve the roughness of the etching pattern, and it is possible to improve the selection ratio of the mask MK with respect to the etching target layer EL. In particular, in the case where the height of the mask MK is relatively low, it is preferable that an etching method according to an embodiment of the present invention be used.

It should be noted that it is preferable that the pressure inside the processing chamber 10 be further reduced in a step of supplying DC in the preprocessing (that is, in a step of forming the protective film PT). For example, in a step of supplying DC in the preprocessing, the pressure inside the processing chamber 10 is preferred to be 30 mT than 50 mT.

Further, in a step of etching the etching target layer EL, it is preferable that the pressure inside the processing chamber 10 be lower than the controlled pressure at the time of preprocessing.

As described above, etching methods according to one or more embodiments of the present invention have been described. However, the etching method is not limited to the above-described embodiments, and various variations and modifications can be made within the scope of the present invention. Matters described in the embodiments may be combined within the non-conflicting range.

For example, an etching method according to an embodiment of the present invention may be applied, not only to the capacitively coupled plasma (CCP) apparatus, but also to other plasma processing apparatuses. The other plasma processing apparatuses may be an inductively coupled plasma (ICP) apparatus, a plasma processing apparatus that uses a radial line slot antenna, a helicon wave plasma (HWP) apparatus, an electron cyclotron resonance plasma (ECR) apparatus, etc.

In the present specification, a semiconductor wafer W has been described as the etching target. However, the etching target may be various substrates used for an LCD (Liquid Crystal Display), an FPD (Flat Panel Display), etc., a photomask, a CD substrate, a printed board, etc.

The present application is based on and claims the benefit of priority of Japanese Priority Application No. 2015-230588 filed on Nov. 26, 2015, the entire contents of which are hereby incorporated herein by reference.

DESCRIPTION OF THE REFERENCE NUMERALS

1 Plasma processing apparatus
10 Processing chamber
15 Gas supplying source
20 Susceptor (lower electrode)
25 Gas shower head (upper electrode)
32 First high-frequency power source
34 Second high-frequency power source
65 Exhaust apparatus
70 Variable DC power source
100 Control unit
106 Electro-static chuck
MK Mask
NL Intermediate layer
EL Etching target layer
SOC Spin-on-carbon layer
BCL Block copolymer layer
PS Polystyrene
PMMA Polymethyl methacrylate

What is claimed is:
1. An etching method for etching a silicon-containing layer into a pattern of a mask that is formed by etching, from a block copolymer layer
   that includes a first polymer and a second polymer,
   that is layered on the silicon-containing layer of an object to be processed via an intermediate layer, and
   that is enabled to be self-assembled,
a region including the second polymer and the intermediate layer right under the region, the etching method comprising:
forming a protective film on the mask
   by arranging an upper electrode and a lower electrode facing each other,
   by applying a negative DC voltage to the upper electrode in a processing chamber of a plasma processing apparatus in which the object to be processed is provided,
   by applying radio frequency power to the upper electrode or the lower electrode, and by supplying a process gas including a hydrogen gas and an inert gas to the inside of the processing chamber to generate plasma; and etching the silicon-containing layer after the forming of the protective film.

2. The etching method according to claim 1, wherein, in the etching of the silicon-containing layer, a pressure inside the processing chamber is caused to be lower than a pressure in the inside of the processing chamber in the forming of the protective film.

3. The etching method according to claim 1, wherein, in the forming of the protective film on the mask, the silicon-containing layer is not etched.

4. The etching method according to claim 1, wherein, in the etching of the silicon-containing layer, plasma of a process gas including at least one of a fluorocarbon gas and a hydrofluorocarbon gas is generated in the inside of the processing chamber.

5. The etching method according to claim 1, wherein the first polymer is polystyrene, and the second polymer is polymethyl methacrylate.

6. The etching method according to claim 1, wherein, in the forming of the protective film on the mask, silicon included in the upper electrode is deposited on the mask to form the protective film.

7. The etching method according to claim 1, wherein the protective film is formed while treating the mask with hydrogen plasma.

8. The etching method according to claim 1, wherein the protective film is formed on the silicon-containing layer.

* * * * *